(12) United States Patent
Lee

(10) Patent No.: US 12,495,670 B2
(45) Date of Patent: Dec. 9, 2025

(54) DOUBLE-SIDED ORGANIC LIGHT-EMITTING DISPLAY DEVICE

(71) Applicant: TOVIS CO., LTD., Incheon (KR)

(72) Inventor: Won Gyu Lee, Incheon (KR)

(73) Assignee: TOVIS CO., LTD., Incheon (KR)

( * ) Notice: Subject to any disclaimer, the term of this patent is extended or adjusted under 35 U.S.C. 154(b) by 530 days.

(21) Appl. No.: 17/785,094

(22) PCT Filed: Dec. 10, 2020

(86) PCT No.: PCT/KR2020/018004
§ 371 (c)(1),
(2) Date: Jun. 14, 2022

(87) PCT Pub. No.: WO2021/137463
PCT Pub. Date: Jul. 8, 2021

(65) Prior Publication Data
US 2022/0376021 A1    Nov. 24, 2022

(30) Foreign Application Priority Data
Dec. 31, 2019   (KR) .......................... 10-2019-0179480

(51) Int. Cl.
*H10K 50/856*   (2023.01)
*H10K 59/128*   (2023.01)
(Continued)

(52) U.S. Cl.
CPC ......... *H10K 50/856* (2023.02); *H10K 59/128* (2023.02); *H10K 59/805* (2023.02);
(Continued)

(58) Field of Classification Search
CPC .... H10K 59/128; H10K 50/856; H10K 50/85; H10K 59/176; H10K 59/875;
(Continued)

(56) References Cited

U.S. PATENT DOCUMENTS 8,957,437 B2 *   2/2015   Koh ...................... H10K 50/86
                                                           257/98
2004/0027513 A1   2/2004   Yuuki et al.
(Continued)

FOREIGN PATENT DOCUMENTS

JP   2003-161941 A    6/2003
KR   10-1182442 B1    9/2012
(Continued)

OTHER PUBLICATIONS

International Search Report for PCT/KR2020/018004 mailed Mar. 16, 2021 from Korean Intellectual Property Office.

*Primary Examiner* — Steven B Gauthier
*Assistant Examiner* — Alvin L Lee
(74) *Attorney, Agent, or Firm* — Revolution IP, PLLC

(57) ABSTRACT

A double-sided organic light-emitting display device includes: a first electrode layer for emitting electrons; a second electrode layer which emits holes and is disposed perpendicularly to the first electrode layer; an organic light-emitting layer interposed between the first electrode layer and the second electrode layer, and including multiple pixels so as to emit light at a portion where the first electrode layer and the second electrode layer intersect with each other, by the collision between the electrons and the holes; and a reflector unit formed in an arbitrary pattern which reflects, in the opposite direction, light transmitted through the first or the second electrode layer, or a pattern reversed with respect to the arbitrary pattern, such that the multiple pixels display a first image on one surface in the arbitrary pattern, and display a second image on the other surface in the pattern reversed with respect to the arbitrary pattern.

2 Claims, 9 Drawing Sheets

(51) Int. Cl.
*H10K 59/176* (2023.01)
*H10K 59/80* (2023.01)

(52) U.S. Cl.
CPC ......... *H10K 59/176* (2023.02); *H10K 59/875* (2023.02); *H10K 59/878* (2023.02)

(58) Field of Classification Search
CPC ............... H10K 59/878; H10K 59/805; H10K 2102/3031; H10K 50/805
See application file for complete search history.

(56) References Cited

U.S. PATENT DOCUMENTS

| | | |
|---|---|---|
| 2006/0097631 A1 | 5/2006 | Lee |
| 2011/0148944 A1 | 6/2011 | Kobayashi |
| 2011/0180825 A1 | 7/2011 | Lee et al. |
| 2011/0303906 A1 | 12/2011 | Goldmann |
| 2013/0028503 A1 | 1/2013 | Wakui et al. |
| 2013/0299808 A1* | 11/2013 | Sugimoto ............ H10K 50/805 257/89 |
| 2014/0197388 A1* | 7/2014 | Zhang .................. H10K 59/878 257/40 |
| 2015/0076456 A1* | 3/2015 | Choi ..................... H10K 59/128 438/34 |
| 2016/0103649 A1* | 4/2016 | Yoshitani ............. G06F 3/1446 345/694 |
| 2017/0110525 A1* | 4/2017 | Cheng ................ H10K 59/1213 |

FOREIGN PATENT DOCUMENTS

| | | |
|---|---|---|
| KR | 10-2014-0067455 A | 6/2014 |
| KR | 10-1511117 B1 | 4/2015 |
| KR | 10-1601746 B1 | 3/2016 |
| KR | 10-2016-0063116 A | 6/2016 |
| KR | 10-2016-0069051 A | 6/2016 |
| KR | 101950843 B1 * | 2/2019 ........... H10K 50/865 |

\* cited by examiner

DOUBLE-SIDED ORGANIC LIGHT-EMITTING DISPLAY DEVICE

TECHNICAL FIELD

The present invention relates to a double-sided organic light-emitting display device capable of displaying images on both surfaces thereof.

BACKGROUND ART

In general, display devices are devices for displaying images, and the display devices display images on only one surface thereof.

Recently, as a transparent electrode has been developed, a transparent display device that allows users to see what is shown on the screen of the device while still being able to see through it has been developed so as to display images on both surfaces of the device, but the users may see the same images on the surfaces of the device.

In order to solve such a problem, Korean Patent Registration No. 10-1511117 (Published on Apr. 10, 2015) discloses "A dual-sided display".

In the above conventional dual-sided display, some pixels are blanked in an arbitrary pattern so that an image displayed by these pixels is not seen on one surface of a display panel, blank means are installed in the remaining pixels in which blanking is not carried out, and thereby, the image displayed by the pixels which have been blanked and an image displayed by the remaining pixels which have not been blanked may be displayed on both surfaces of the display panel.

However, in the conventional dual-sided display, blanking is performed regularly, and thus, moiré interference occurs due to light interference.

Further, in the conventional dual-sided display, the blank means, which are installed on the outer surface of the display panel, may be easily damaged, and the images displayed on both surfaces of the display panel may be unclear due to damage to the blank means.

DISCLOSURE

Technical Problem

Therefore, the present invention has been made in view of the above problems, and it is an object of the present invention to provide a double-sided organic light-emitting display device which may prevent occurrence of moiré interference and damage to blank means so as to provide clear images.

Technical Solution

In accordance with the present invention, the above and other objects can be accomplished by the provision of a double-sided organic light-emitting display device including a first electrode layer configured to emit electrons, second electrode layer configured to emit holes and disposed perpendicular to the first electrode layer, an organic light-emitting layer interposed between the first electrode layer and the second electrode layer and including a plurality of pixels so as to emit light at intersections between the first electrode layer and the second electrode layer by recombination of the electrons and the holes, and a reflector unit formed in an arbitrary pattern configured to reflect light transmitted by the first electrode layer or the second electrode layer in an opposite direction, or in a reverse pattern to the arbitrary pattern, such that the plurality of pixels displays a first image in the arbitrary pattern on one surface of the double-sided organic light-emitting display device, and displays a second image in the reverse pattern to the arbitrary pattern on a remaining surface of the double-sided organic light-emitting display device.

The first electrode layer or the second electrode layer may be formed of a transparent electrode so as to transmit light reflected by the reflector unit.

The reflector unit may be formed by adhering or printing a metal thin film formed in the arbitrary pattern or in the reverse pattern to the arbitrary pattern to or on the first electrode layer or the second electrode layer.

The arbitrary pattern may be formed irregularly so as to reduce moiré interference.

The double-sided organic light-emitting display device may further include a glass substrate configured to protect the first electrode layer or the second electrode layer, and the reflector unit may be formed by adhering or printing a metal thin film formed in the arbitrary pattern or in the reverse pattern to the arbitrary pattern to or on the glass substrate.

The reflector unit may be implemented as a half-mirror configured to transmit some light and to reflect remaining light.

The double-sided organic light-emitting display device may further include an image controller configured to control image signals so that, among the plurality of pixels, pixels corresponding to the arbitrary pattern and pixels corresponding to the reverse pattern to the arbitrary pattern display reverse images or different images.

Advantageous Effects

According to the present invention, a reflector unit configured to reflect light may be formed in a first electrode layer or a second electrode layer so as to display different images on both surfaces of a double-sided organic light-emitting display device, and the reflector unit may be prevented from being exposed to the outside, thereby being capable of preventing damage to the reflector unit and thus displaying clear images.

Further, the reflector unit may be formed as a half-mirror so as to prevent degradation of resolution, and the reflector unit may be irregularly formed in an arbitrary pattern, thereby being capable of preventing occurrence of moiré interference.

DESCRIPTION OF REFERENCE NUMERALS OR SYMBOLS

Figure 1:
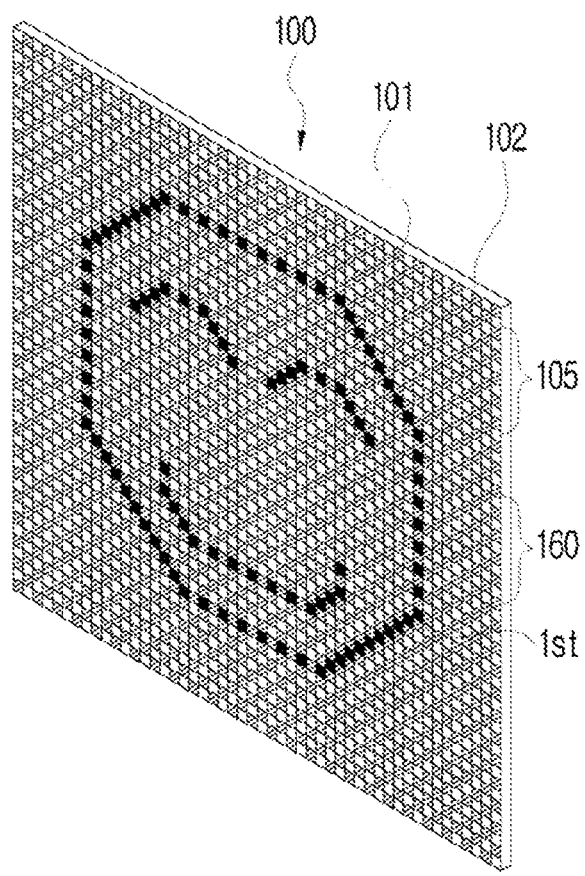
FIG. 1 is a perspective view schematically illustrating a double-sided organic light-emitting display device according to a first embodiment of the present invention.
Figure 2:
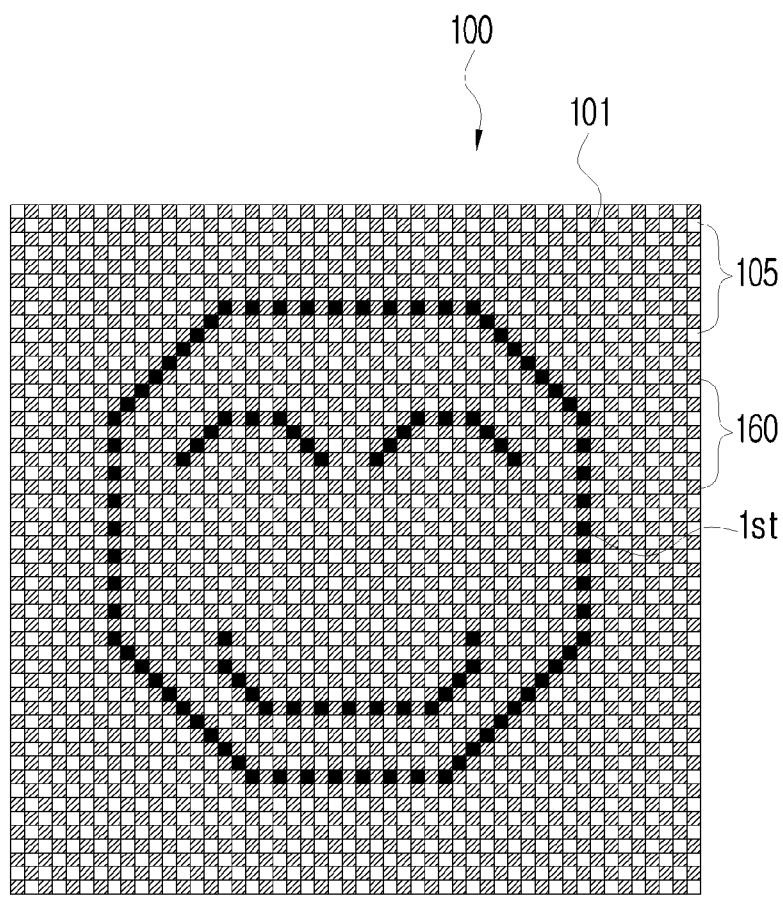
FIG. 2 is a front view illustrating a first image displayed on one surface of the double-sided organic light-emitting display device according to the first embodiment of the present invention.

- 100: double-sided organic light-emitting display device
- 101: one surface
- 102: other surface 105: pixel
- 110: first electrode layer 120: second electrode layer
- 130: organic light-emitting layer 140: thin film transistor substrate
- 145: transistor 150: glass substrate
- 160, 160': reflector unit 170: encapsulation layer
- 1st: first image 2nd: second image Best Mode Hereinafter, exemplary embodiments of the present invention will be described with reference to the accompanying drawings.

First, a double-sided organic light-emitting display device 100 according to one embodiment of the present invention may display a first image 1st on one surface 101 thereof, and may display a second image 2nd on the other surface 102 thereof.

The first image 1st and the second image 2nd may be different images, or the first image 1st and the second image 2nd may be reverse images, or may be exactly the same.

Figure 4:
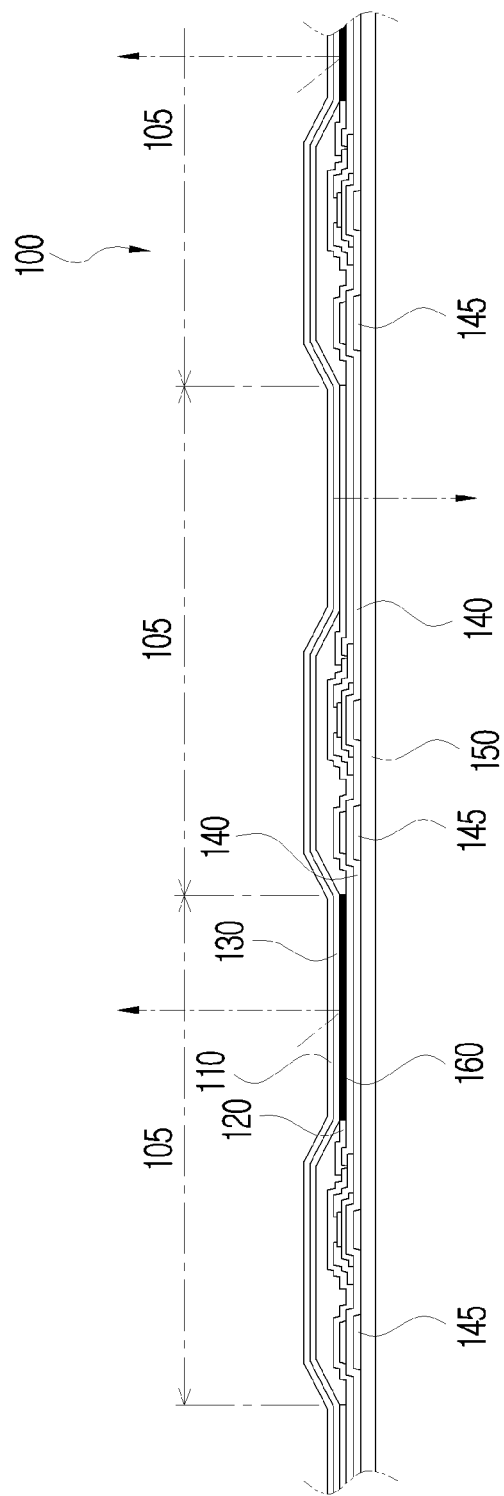
FIG. 4 is a partial cross-sectional view of the double-sided organic light-emitting display device according the first embodiment of the present invention, illustrating a reflector unit as one example.

As shown in FIG. 4, a double-sided organic light-emitting display device 100 according to a first embodiment of the present invention may include a first electrode layer 110 and a second electrode layer 120.

The first electrode layer 110 may emit electrons, the first electrode layer 110 may include a plurality of fine conducting wires arranged in parallel so as to be spaced apart from each other, and the conducting wires may be formed of a conductive material so as to emit electrons.

The first electrode layer 110 may be configured in a form in which the conducting wires are deposited on a thin film.

The first electrode layer 110 may be configured in a form in which an electron injection layer, into which electrons generated by the first electrode layer are injected, and an electron transfer layer, to which the electrons injected into the electron injection layer are transferred, are combined with each other.

The second electrode layer 120 may emit holes, the second electrode layer 120 may include a plurality of fine conducting wires arranged in parallel so as to be spaced apart from each other, and the conducting wires may be formed of a conductive material so as to emit holes.

The conducting wires of the second electrode layer 120 may be installed to intersect the conducting wires of the first electrode layer 110 at right angles.

The second electrode layer may be configured in a form in which a hole injection layer, into which holes are injected, and a hole transfer layer, to which the holes injected into the hole injection layer are transferred, are combined with each other.

Although this embodiment describes that the first electrode layer 110 emits electrons and the second electrode layer 120 emits holes, the first electrode layer 110 may be configured to emit holes and the first electrode layer 110 may be configured to emit electrons.

Here, when one of the first electrode layer 110 and the second electrode layer 120 includes gate lines, the other may be implemented to include data lines, and pixels 105 may be controlled to emit light in response to image signals received through the gate lines and the data lines.

As shown in FIG. 4, the double-sided organic light-emitting display device 100 according to the first embodiment of the present invention may include an organic light-emitting layer 130.

The organic light-emitting layer 130 may be disposed between the first electrode layer 110 and the second electrode layer 120, and the organic light-emitting layer 130 may emit light due to recombination of electrons emitted by the first electrode layer 110 and holes emitted by the second electrode layer 120.

The organic light-emitting layer 130 may be formed of a low molecular weight or polymeric organic material, and the organic light-emitting layer 130 may be located between the first electrode layer 110 and the second electrode layer 120 by a vapor deposition method (or a patterning method) or an inkjet printing method (or a spin-coating method).

Here, parts of the electrode of the first electrode layer 110 and the electrode of the second electrode layer 120, which intersect each other, may form pixels 105 which emit light so as to display images, and the electrode of the first electrode layer 110 and the electrode of the second electrode layer 120 may have a plurality of intersections, and may thus display images through a plurality of pixels 105.

Here, one pixel 105 may express all of R, G and B colors.

Any one or both of the first electrode layer 110 and the second electrode layer 120 may be formed of a transparent electrode, i.e., ITO, which transmits light.

As shown in FIG. 4, the double-sided organic light-emitting display device 100 according to the first embodiment of the present invention may include a thin film transistor substrate 140.

The thin film transistor substrate 140 overlaps the first electrode layer 110 or the second electrode layer 120, and supplies or blocks current thereto, thereby being capable of controlling light emission in the organic light-emitting layer 130.

The thin film transistor substrate 140 may be formed by mounting a plurality of transistors 145 on a thin-film sheet, and the transistor 145 may be located in each of the pixels 105 where the first electrode layer 110 and the second electrode layer 120 intersect each other, and may control light emission in each pixel 105.

The thin film transistor substrate 140 may be attached to a glass substrate 150, an encapsulation layer 170 configured to seal the organic light-emitting layer 130 together with the glass substrate 150 may be formed on the outermost surface of the thin film transistor substrate 140 opposite to the glass substrate 150, and the encapsulation layer 170 may be formed by stacking a transparent glass substrate 150 or a flexibly bendable synthetic resin substrate, or may be formed through molding using a polymer synthetic resin.

Although this embodiment describes that the thin film transistor substrate 140 is attached to the glass substrate 150, the glass substrate 150 may be replaced with a polyimide (PI) substrate which is flexibly bendable, thereby being capable of implementing a flexible double-sided display device.

As shown in FIGS. 1 to 4, the double-sided organic light-emitting display device 100 according to the first embodiment of the present invention may include a reflector unit 160.

The reflector unit 160 may reflect light emitted by the organic light-emitting layer 130 in a direction opposite to the direction in which the organic light-emitting layer 130 emits light to display an image, and may allow another image to be displayed on a surface opposite to the surface on which the image is displayed due to light emitted by the organic light-emitting layer 130.

The reflector unit 160 may reflect light emitted by the pixel 105 located in a predetermined arbitrary pattern among all the pixels 105 in the direction opposite to the image display direction, thereby being capable of allowing images to be displayed on the surface 101 and the other surface 102.

The reflector unit 160 may be formed in one of the first electrode layer 110 and the second electrode layer 120.

For example, when the reflector unit 160 is configured to reflect light emitted by the plurality of pixels 105 in a mosaic pattern, one image is intactly displayed in the image display direction in regions without the reflector unit 160, light is reflected and another image is displayed in the direction opposite to the image display direction in regions covered with a mosaic, and thereby, the images may be displayed on both surfaces.

That is, light is transmitted and one image is intactly displayed in the pixels 105 in which the reflector unit 160 is not located, light is reflected and another image is displayed in the direction opposite to the image display direction in the pixels 105 in which the reflector unit 160 is located.

For example, the arbitrary pattern may regularly or irregularly reflect light emitted by some pixels 105 among the plurality of pixels 105 in the opposite direction, so that any one pixel 105 among the plurality of pixels 105 transmits light so as to display one image and the pixels 105 adjacent to the pixel 105 reflect light in the opposite direction through the reflector unit 160.

As one example, the reflector unit 160 may be configured such that a metal material is provided and patterned in an arbitrary pattern so as to reflect light and a light-transmissive material is provided in a remaining area and patterned so as to transmit light, when the electrode of one of the first electrode layer 110 and the second electrode layer 120 is formed.

Figure 5:
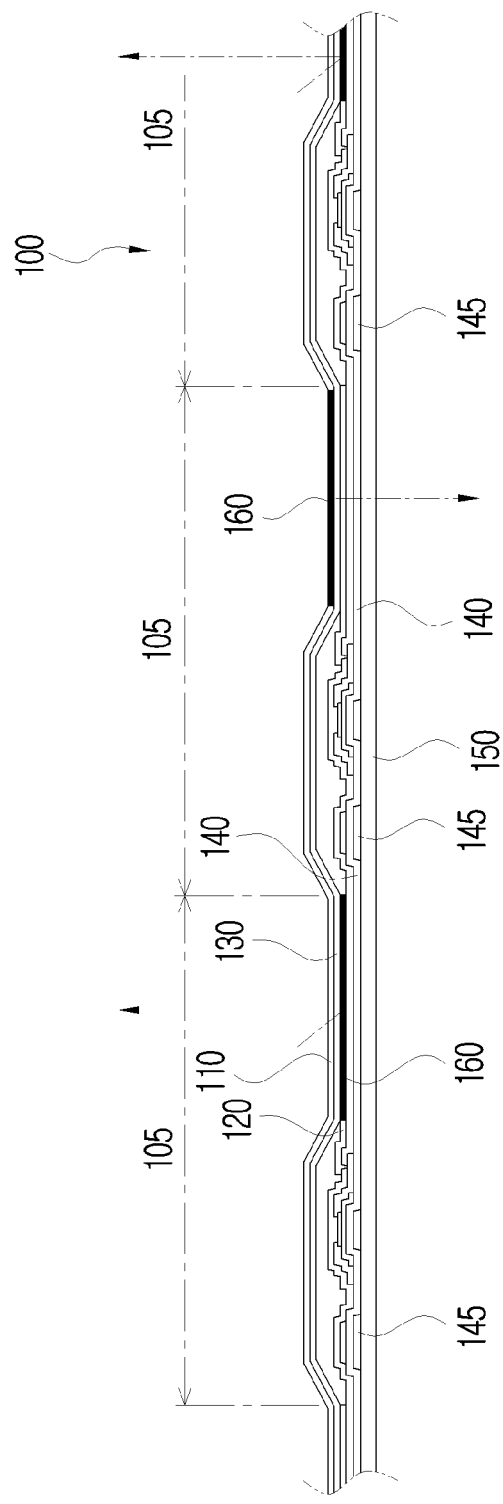
FIG. 5 is a partial cross-sectional view of the double-sided organic light-emitting display device according the first embodiment of the present invention, illustrating a reflector unit, as another example.

As shown in FIG. 5, as another example, the reflector unit 160 may be configured such that, when the reflector unit 160 is formed in an arbitrary pattern in the first electrode layer 110, the reflector unit 160 is formed in a reverse pattern to the arbitrary pattern in the second electrode layer 120, thereby being capable of reflecting light emitted by the organic light-emitting layer 130 in the opposite directions so as to display images.

Figure 6:
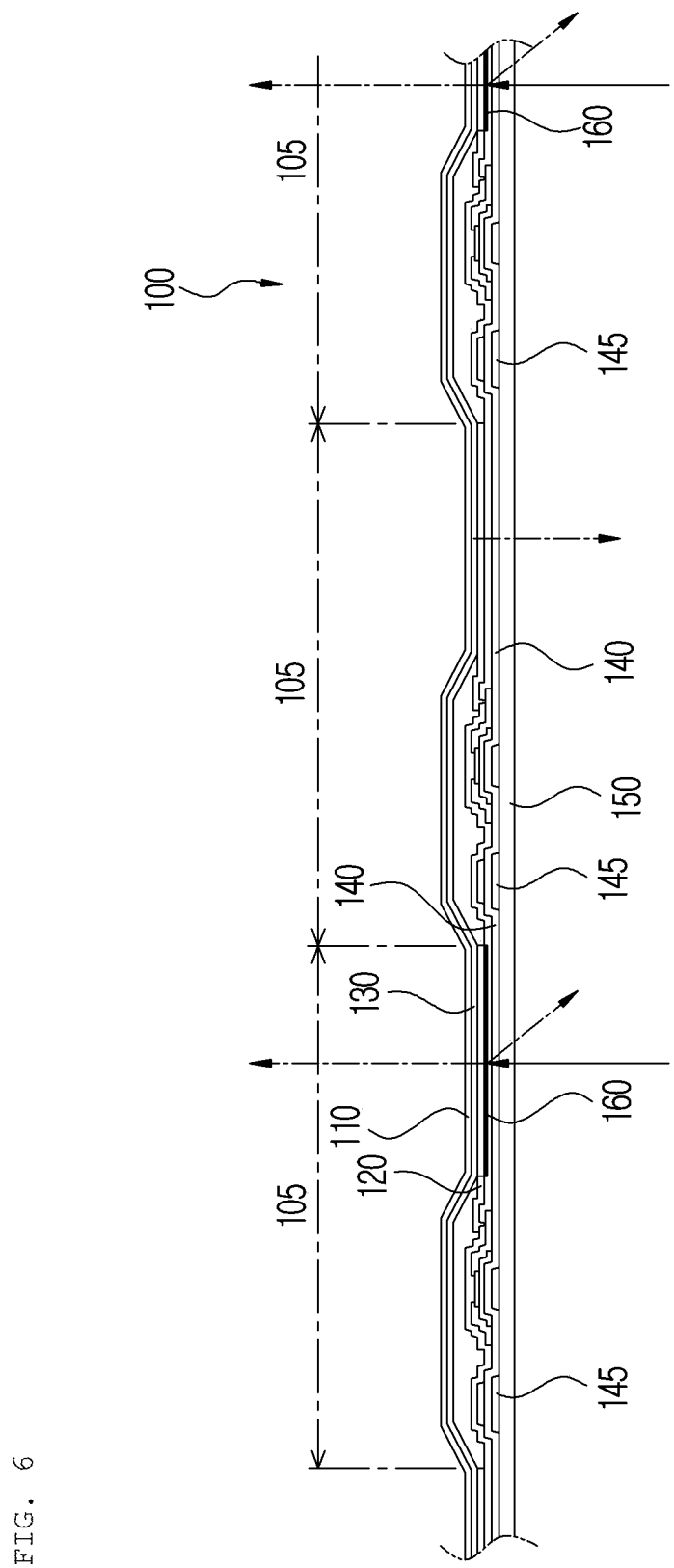
FIG. 6 is a partial cross-sectional view of the double-sided organic light-emitting display device according the first embodiment of the present invention, illustrating a reflector unit, as yet another example.

As shown in FIG. 6, as yet another example, the reflector unit 160 may be formed by printing or adhering a reflective material formed in an arbitrary pattern on or to the outer surface of the first electrode layer 110 or the second electrode layer 120, and the reflective may be a metal material.

When the arbitrary pattern of the reflector unit 160 is regular, moiré interference may occur due to mutual interference between adjacent pixels 105, and, when the arbitrary pattern of the reflector unit 160 is irregular, mutual interference between adjacent pixels 105 may be prevented and thus moiré interference may be prevented.

The reflector unit 160 may be formed as a half-mirror so as to transmit some polarized light and to reflect the remaining polarized light, and thus does not completely block light but transmits some light in regions in which the reflector unit 160 is formed, thereby being capable of minimizing regions shielded by the arbitrary pattern of the reflector unit 160 and thus preventing degradation of resolution.

Here, some light is transmitted by the reflector unit 160 on one surface 101 configured to display an original image and thus degradation of resolution may be prevented, but only some polarized light is transmitted by the reflector unit 160 on the other surface 102 configured to display another image by reflection and thus illuminance may be reduced.

The arbitrary pattern of the reflector unit 160 may be configured to alternately reflect light along horizontal lines or to alternately reflect light along vertical lines, or may be implemented in various shapes, such as in a mosaic or any arbitrary patterned shapes.

Figure 7:
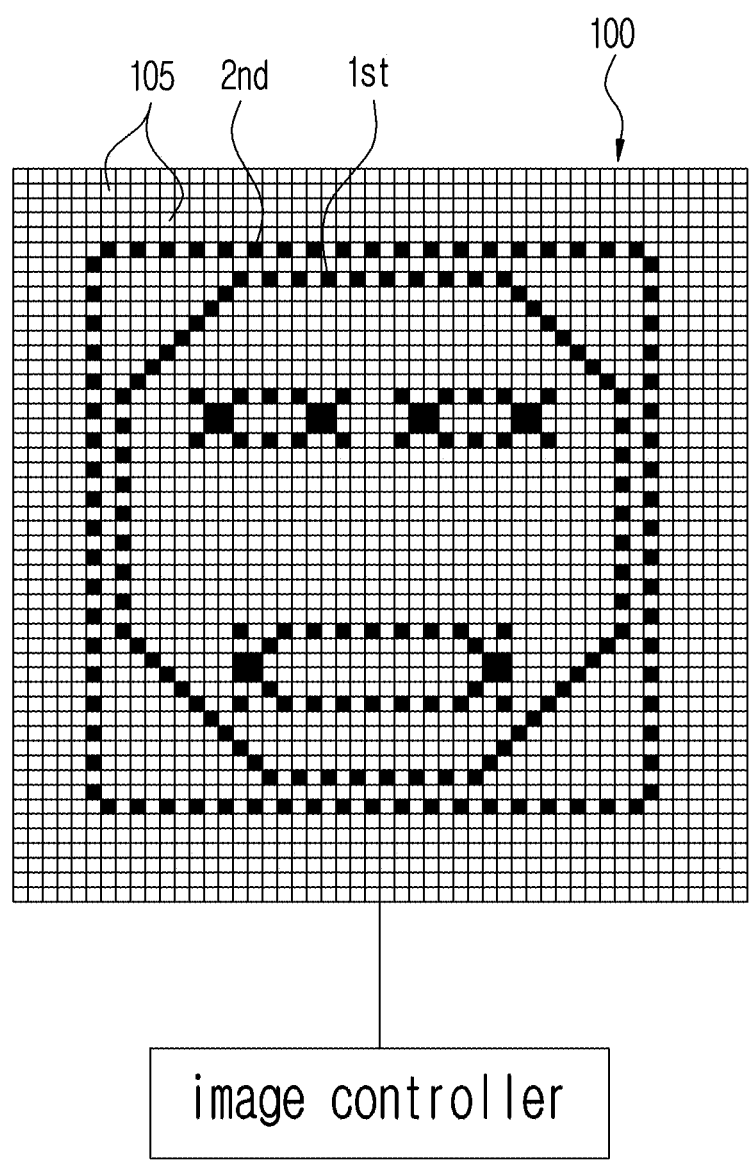
FIG. 7 is a view schematically illustrating the images provided by an image controller of the double-sided organic light-emitting display device according to the first embodiment of the present invention.

As shown in FIG. 7, the double-sided organic light-emitting display device 100 according to the first embodiment of the present invention may include an image controller.

Figure 3:
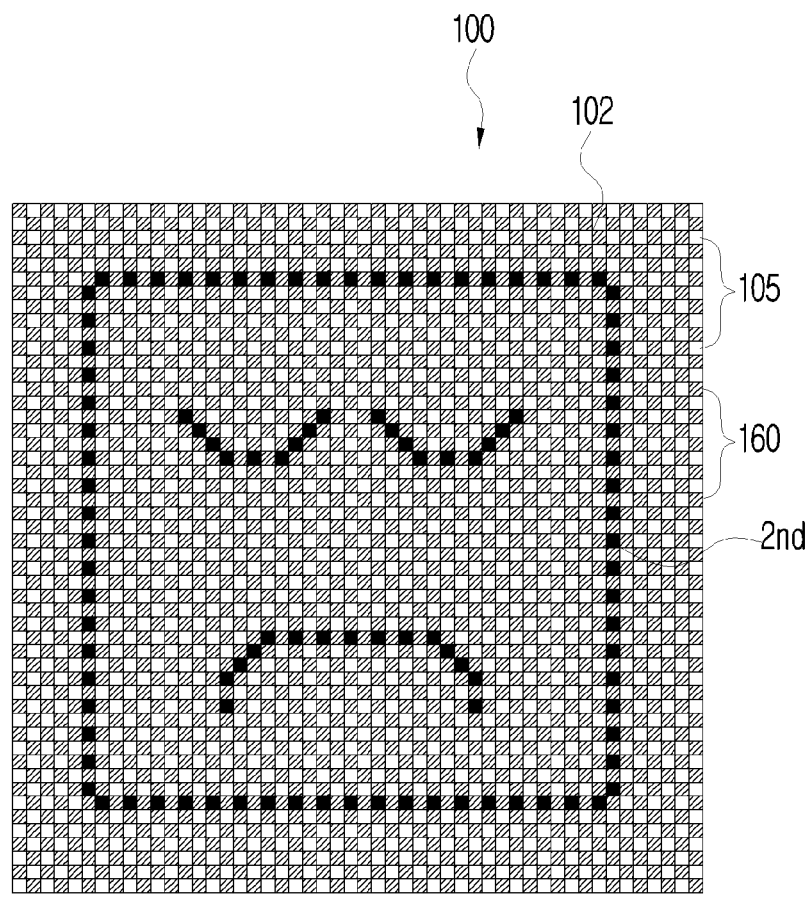
FIG. 3 is a front view illustrating a second image displayed on the other surface of the double-sided organic light-emitting display device according to the first embodiment of the present invention.

The image controller may control image signals so that the first image 1st is displayed on the surface 101 of the double-sided organic light-emitting display device 100 and the second image 2nd is displayed on the other surface 102 as shown in FIG. 3.

As one example, when both the first image 1st and the second image 2nd are provided, the image controller may control image signals provided to the respective pixels 105 so as to display the first image 1st through the pixels 105 corresponding to a reverse pattern to the arbitrary pattern of the reflector unit 160.

Further, the image controller may control the image signals provided to the respective pixels 105 so as to display the second image 2nd through the pixels 105 corresponding to the arbitrary pattern of the reflector unit 160.

As another example, the image controller may be configured to perform fusion of the first image 1st and the second image 2nd in advance and then to display the first image 1st and the second image 2nd on both surfaces of the double-sided organic light-emitting display device depending on fused image signals.

For example, the image controller may be configured to remove the images of the pixels 105 located in the arbitrary pattern of the reflector unit 160 from the pixels 105 of the first image 1st corresponding to the arbitrary pattern of the reflector unit 160, to fuse the pixels 105 of the second image 2nd corresponding to the removed pixels 105 to the first image 1st, and to provide the fused image to the double-sided organic light-emitting display device 100, so as to display different images on both surfaces through one image without separate processing of image signals.

The functions and effects of the above-described respective elements will be described as below.

In the double-sided organic light-emitting display device 100 according to the first embodiment of the present invention, the thin film transistor substrate 140 is stacked on the upper surface of the glass substrate 150, the second electrode layer 120 which emits holes is stacked on the thin film transistor substrate 140, and the organic light-emitting layer 130 is stacked on the second electrode layer 120.

Further, the first electrode layer 110 which emits electrons is stacked on the upper surface of the organic light-emitting layer 130, and the encapsulation layer 170 may be formed or an encapsulation substrate may be stacked selectively on the upper surface of the first electrode layer 110.

The second electrode layer 120 and the first electrode layer 110 may have light transmittance, and the reflector unit 160 may be formed in or on one substrate of the first electrode layer 120 and the second electrode layer 110.

The reflector unit 160 which reflects light emitted by some pixels 105 in a direction opposite to the image display direction may be formed in an arbitrary pattern in the plurality of pixels 105 in or on one of the first electrode layer 110 and the second electrode layer 120.

Although this embodiment describes that the reflector unit 160 is formed in the second electrode layer 120, the reflector unit 160 may also be formed in a reverse pattern to the arbitrary pattern of the second electrode layer 120 in the first electrode layer 110.

The above-described double-sided organic light-emitting display device 100 according to the first embodiment of the present invention displays images through emission of light by the respective pixels 105 due to recombination among the holes emitted by the second electrode layer 120 and the electrons emitted by the first electrode layer 110, when the image controller provides image signals.

An image is displayed on one surface 101 of the double-sided organic light-emitting display device 100, and light is reflected in the opposite direction in the pixels 105 corresponding to the arbitrary pattern of the reflector unit 160, is transmitted by the first electrode layer 110, and thus displays another image.

Therefore, the double-sided organic light-emitting display device 100 according to the first embodiment of the present invention reflects light in the direction opposite to the image display direction through the reflector unit 160, thereby being capable of displaying images on both surfaces of the double-sided organic light-emitting display device 100.

Hereinafter, a second embodiment of the present invention will be described. The elements of the second embodiment which are the same as those of the first embodiment have the same functions and effects, and a detailed description of the same elements will thus be omitted.

A double-sided organic light-emitting display device 100 according to the second embodiment of the present invention is characterized in that a reflector unit 160' is provided.

Figure 8:
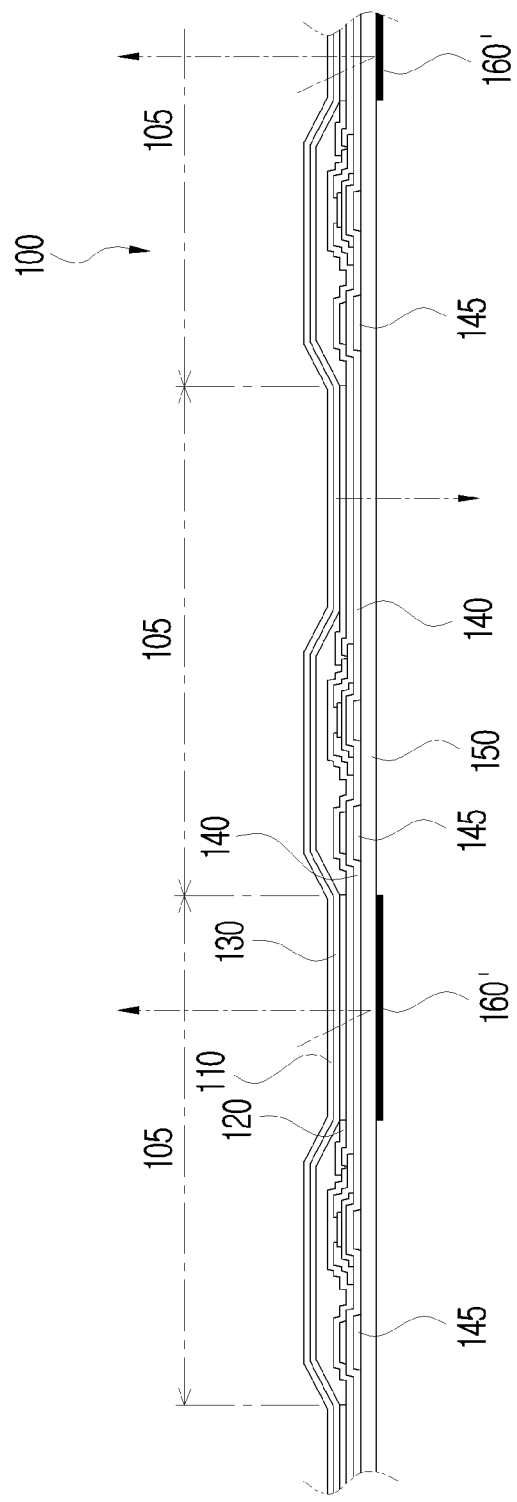
FIG. 8 is a partial cross-sectional view of a double-sided organic light-emitting display device according to a second embodiment of the present invention, illustrating a reflector unit.

As shown in FIG. 8, the reflector unit 160' of the second embodiment may be formed on the encapsulation layer 170 or the glass substrate 150 so as to shield some pixels 105 among all the pixels 105 in an arbitrary pattern.

The reflector unit 160' may reflect light emitted by the organic light-emitting layer 130 in a direction opposite to the direction in which the organic light-emitting layer 130 originally emits light, and emits the reflected light through the other surface 102 opposite to the surface 101, thereby being capable of displaying an image.

The reflector unit 160' may be formed by depositing or printing a metal thin film on the encapsulation layer 170 or the glass substrate 150 in an arbitrary pattern, or by adhering a metal thin film sheet formed in an arbitrary pattern to the encapsulation layer 170 or the glass substrate 150.

Figure 9:
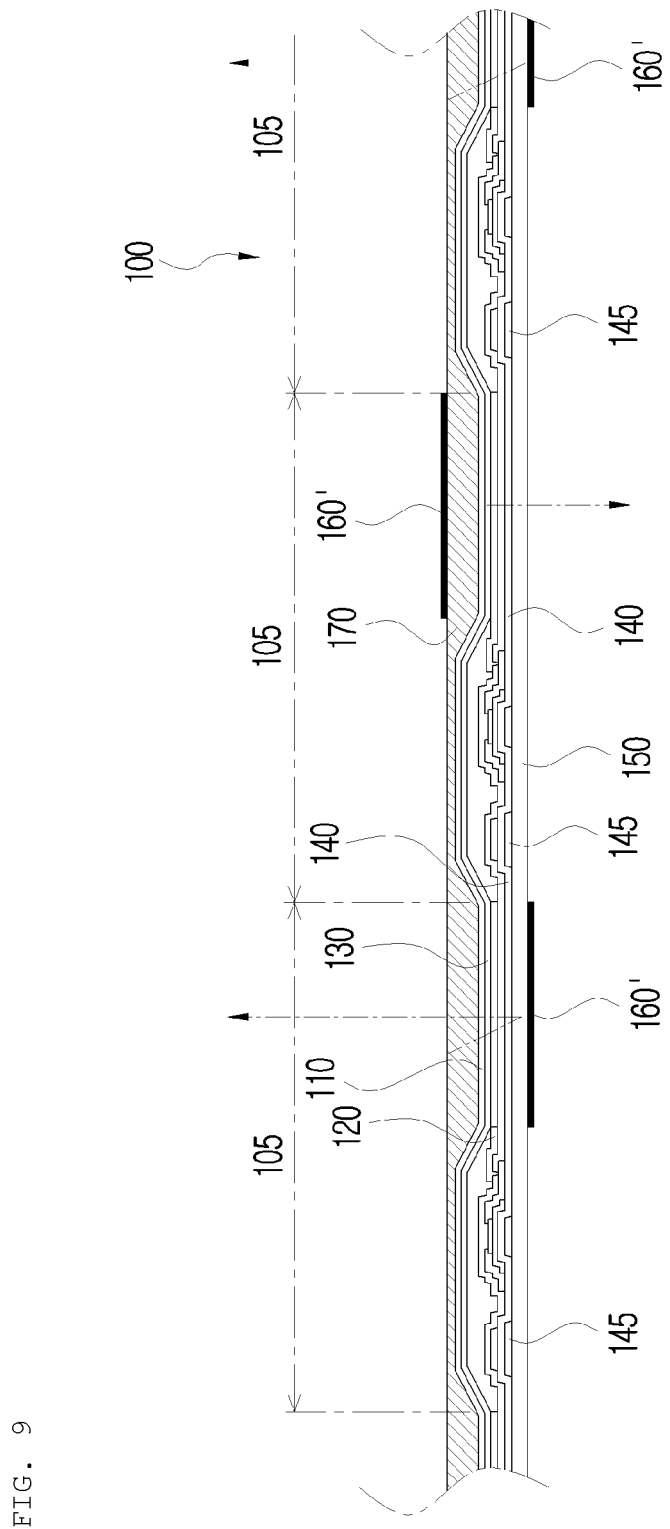
FIG. 9 is a partial cross-sectional view of the double-sided organic light-emitting display device according to the second embodiment of the present invention, illustrating a modified example of the reflector unit.

As shown in FIG. 9, as a modified example, the reflector unit 160' may be formed on the glass substrate 150 in an arbitrary pattern, and may also be formed on the encapsulation layer 170 in a reverse pattern to the arbitrary pattern.

The double-sided organic light-emitting display device 100 having the above-described configuration according to the second embodiment of the present invention generates light through recombination between holes emitted by the first electrode layer 110 and electrons emitted by the second electrode layer 120 in the organic light-emitting layer 130, and emits the generated light through the glass substrate 150, thereby displaying images.

Further, among light emitted by the plurality of pixels 105, light emitted by the pixels 105 corresponding to the arbitrary pattern of the reflector unit 160' is reflected in the direction opposite to the image display direction, and thereby, images may be displayed on both surfaces of the double-sided organic light-emitting display device.

Therefore, the double-sided organic light-emitting display device 100 according to the second embodiment of the present invention may reflect light in the direction opposite to the image display direction through the reflector unit 160', thereby being capable of displaying images on both surfaces of double-sided organic light-emitting display device 100.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A double-sided organic light-emitting display device, comprising:
    a first electrode layer configured to emit electrons;
    a second electrode layer configured to emit holes and disposed perpendicularly to the first electrode layer;
    an organic light-emitting layer interposed between the first electrode layer and the second electrode layer and including a plurality of pixels at intersections of the first and second electrode layers, the organic light-emitting layer emitting light by recombination of the electrons and the holes at the intersections; and
    a reflector unit comprising a patterned reflective layer disposed on at least one of the first electrode layer and the second electrode layer, the patterned reflective layer being arranged in an arbitrary pattern covering a second subset of the plurality of pixels and absent over a first subset of the plurality of pixels, wherein the arbitrary pattern is an irregularly alternating pattern selected from the group consisting of horizontally alternating lines, vertically alternating lines, mosaic patterns, and combinations thereof, such that light emitted from the organic light-emitting layer at the second subset of pixels is reflected by the patterned reflective layer in a direction opposite to an original emission direction to produce a second image on one side of the display device, while light emitted from the first subset of pixels passes through the display device to produce a first image on an opposite side of the display device,
    wherein the patterned reflective layer of the reflector unit comprises a metal thin film that is attached by adhering or printing onto the at least one electrode layer,
    wherein the reflector unit is implemented as a half-mirror configured to transmit some light and to reflect remaining light.

2. The double-sided organic light-emitting display device according to claim 1, wherein the first electrode layer or the second electrode layer is formed of a transparent electrode so as to transmit light reflected by the reflector unit.

\* \* \* \* \*